(12) United States Patent
Edrei et al.

(10) Patent No.: US 8,999,785 B2
(45) Date of Patent: Apr. 7, 2015

(54) FLASH-TO-ROM CONVERSION

(75) Inventors: Itzhak Edrei, Haifa (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 622 days.

(21) Appl. No.: 13/246,234

(22) Filed: Sep. 27, 2011

(65) Prior Publication Data
US 2013/0075803 A1  Mar. 28, 2013

(51) Int. Cl.
*H01L 21/336* (2006.01)
*H01L 29/788* (2006.01)
*H01L 21/28* (2006.01)
*H01L 29/66* (2006.01)
*H01L 27/112* (2006.01)
*H01L 27/115* (2006.01)

(52) U.S. Cl.
CPC ........ *H01L 29/788* (2013.01); *H01L 21/28273* (2013.01); *H01L 29/66825* (2013.01); *H01L 27/1126* (2013.01); *H01L 27/11519* (2013.01); *H01L 27/11521* (2013.01); *H01L 27/11526* (2013.01)

(58) Field of Classification Search
CPC ..................... H01L 21/28273; H01L 27/1126; H01L 27/11519; H01L 27/11521; H01L 27/11526; H01L 29/66825; H01L 29/788

USPC ................. 438/286, 197, 214, 288, 230, 258; 257/E21.667
See application file for complete search history.

(56) References Cited

U.S. PATENT DOCUMENTS

| | | | |
|---|---|---|---|
| 6,030,871 A | 2/2000 | Eitan | |
| 6,468,869 B1 | 10/2002 | Yang et al. | |
| 6,765,259 B2 | 7/2004 | Kim | |
| 6,822,286 B2 | 11/2004 | Hsu et al. | |
| 7,227,234 B2 | 6/2007 | Roizin et al. | |
| 7,402,482 B2 | 7/2008 | Weiner | |
| 7,482,233 B2 | 1/2009 | Roizin et al. | |
| 7,800,156 B2 | 9/2010 | Roizin et al. | |
| 2008/0160689 A1 | 7/2008 | Fenigstein et al. | |

*Primary Examiner* — Jose R Diaz
(74) *Attorney, Agent, or Firm* — Bever, Hoffman & Harms, LLP

(57) ABSTRACT

Flash-to-ROM conversion is performed by converting single transistor flash memory cells to single transistor ROM cells. An S-Flash memory cell is converted to a programmed ROM cell by introducing a threshold voltage implant into the channel region of the S-Flash memory cell. Alternately, an S-Flash memory cell is converted to a programmed ROM cell by introducing a threshold voltage implant into a substrate region in alignment with an edge of the gate electrode of the S-Flash memory cell. The width of the mask through which this threshold voltage implant is performed can be varied, such that the threshold voltage implant region can have different dopant concentrations, thereby allowing multiple bits to be represented by the programmed ROM cell. In another embodiment, a Y-flash memory cell is converted to a programmed ROM cell by adjusting the length of a floating gate extension region of the Y-Flash memory cell.

6 Claims, 13 Drawing Sheets

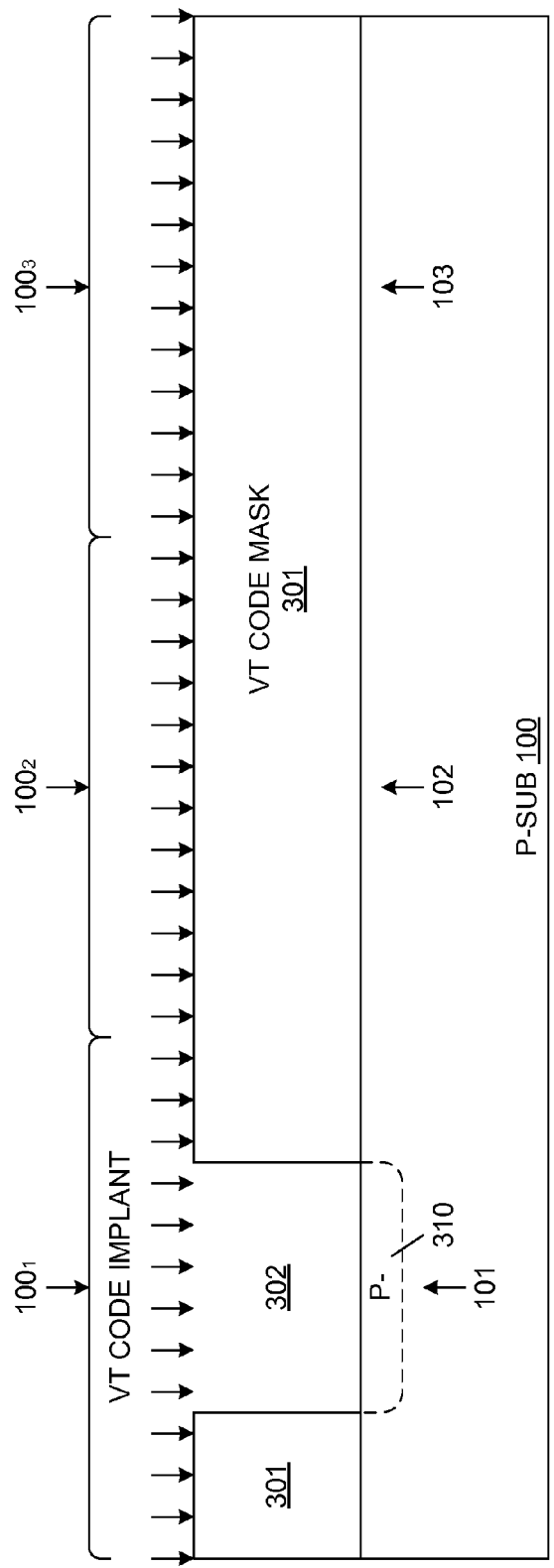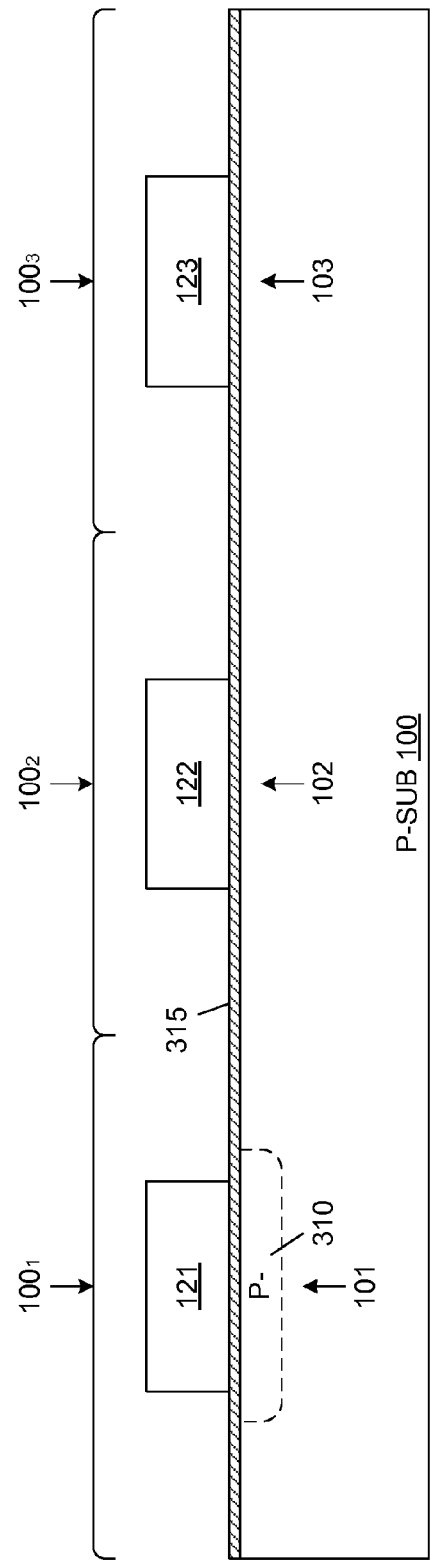

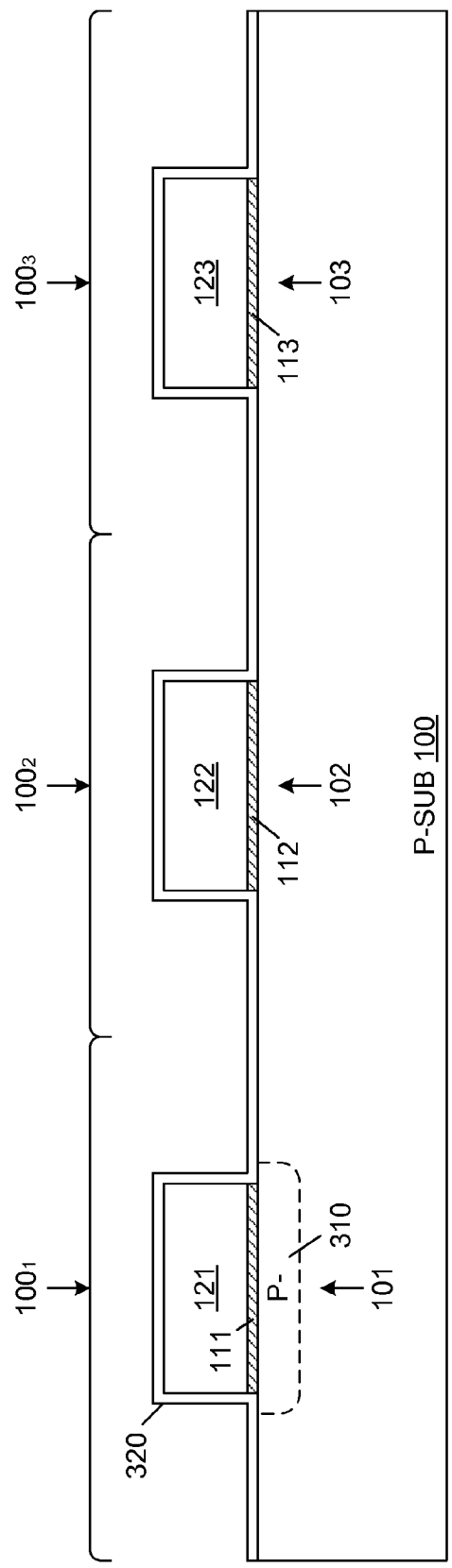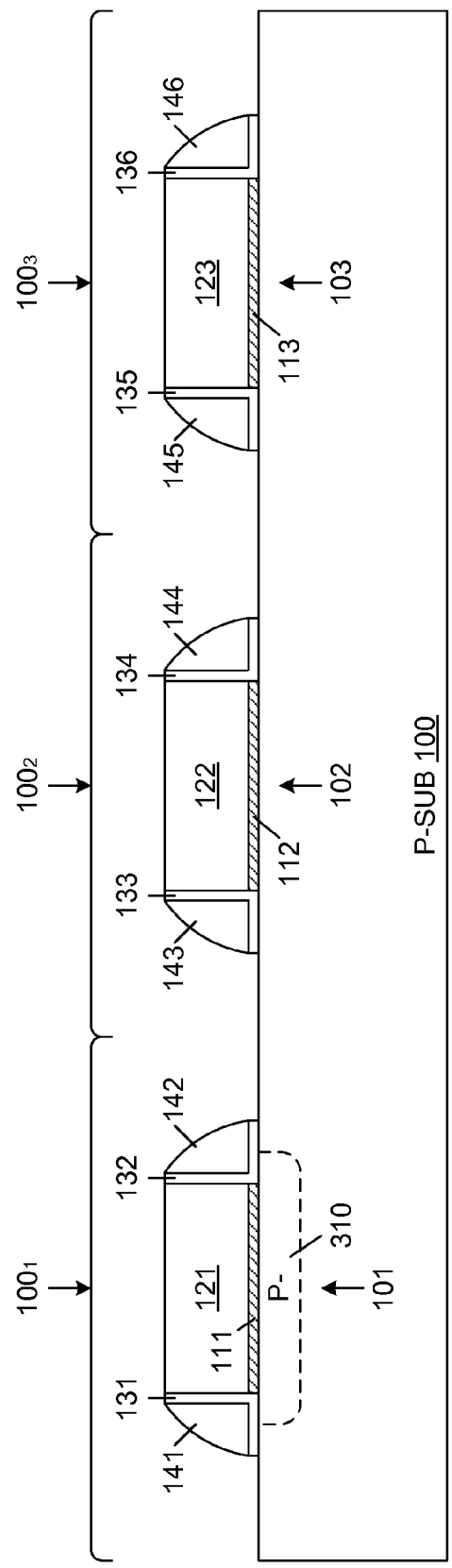

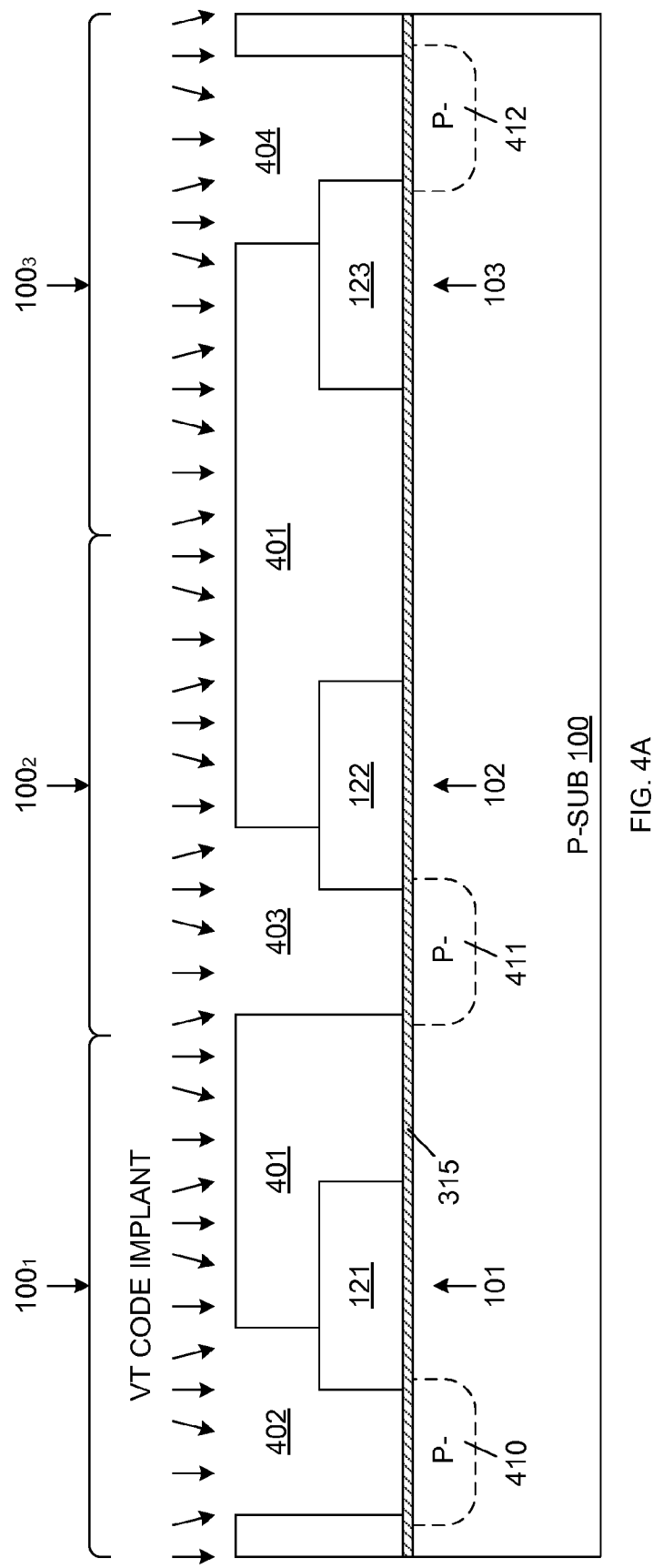

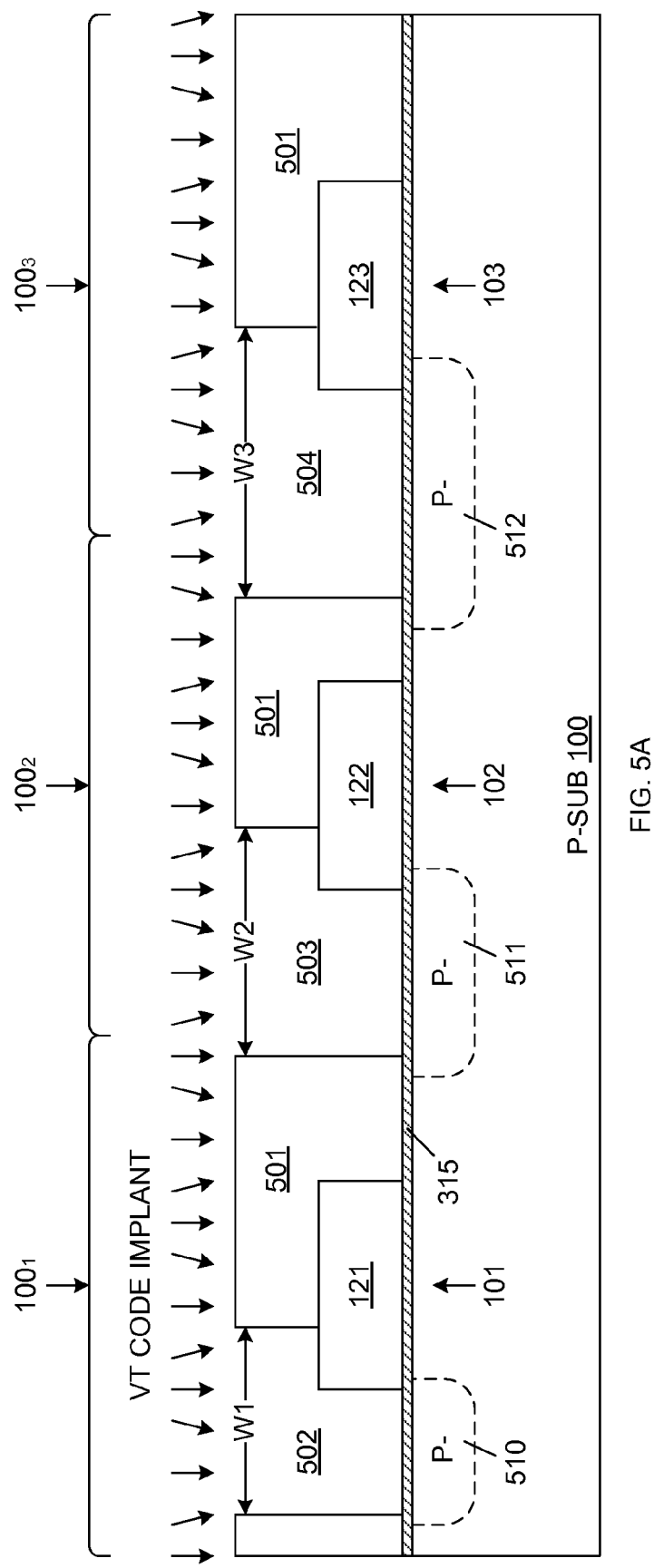

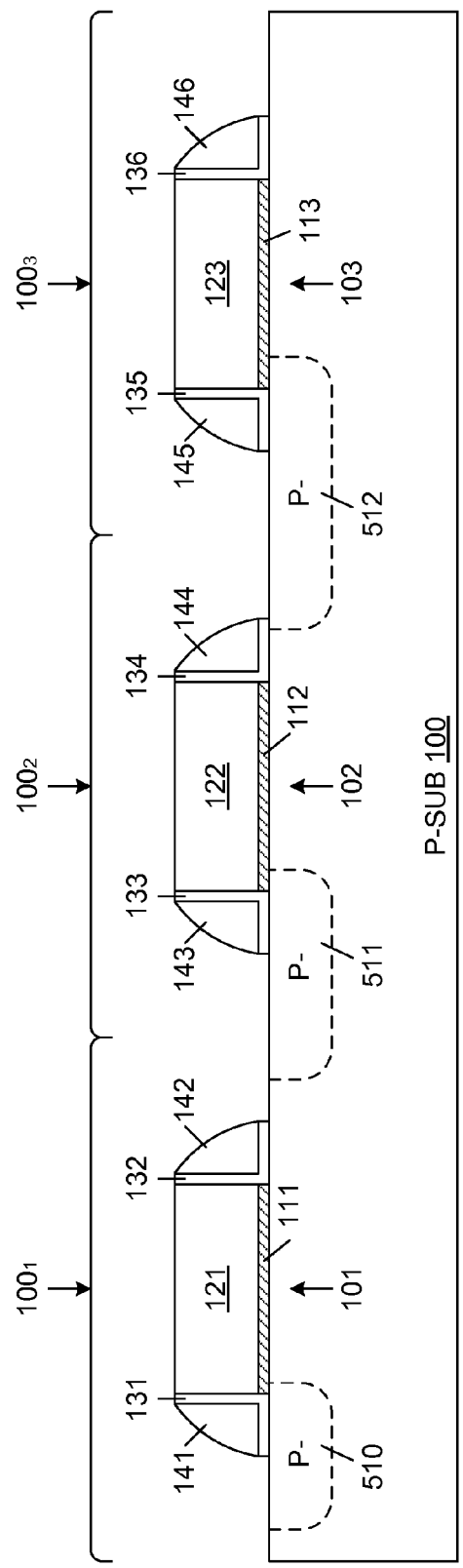
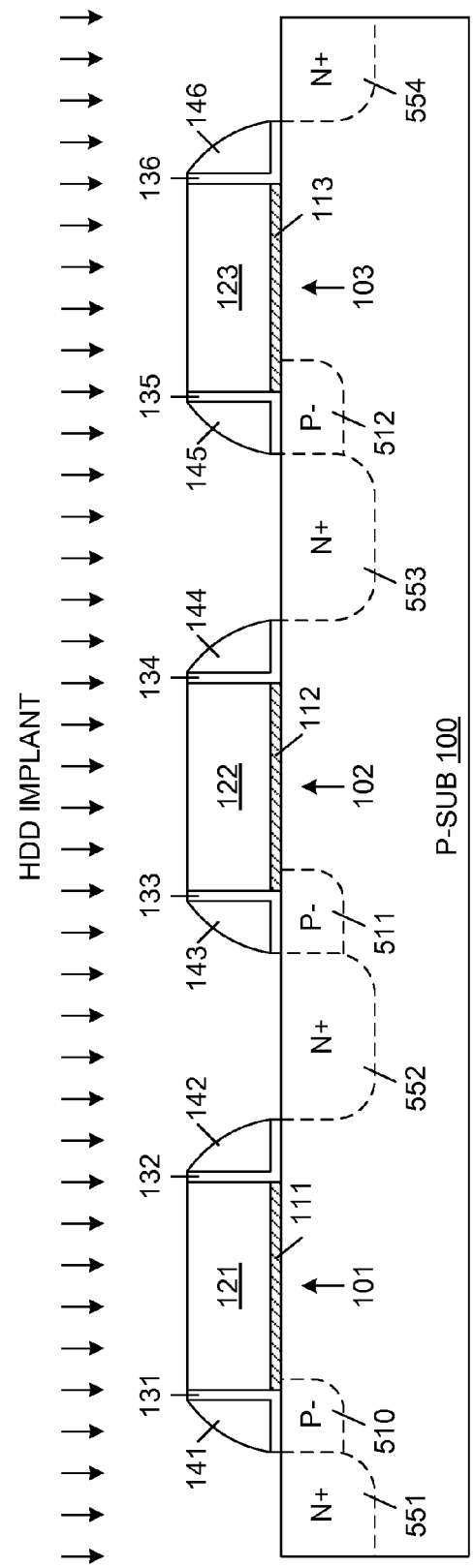
FIG. 5B
FIG. 5C

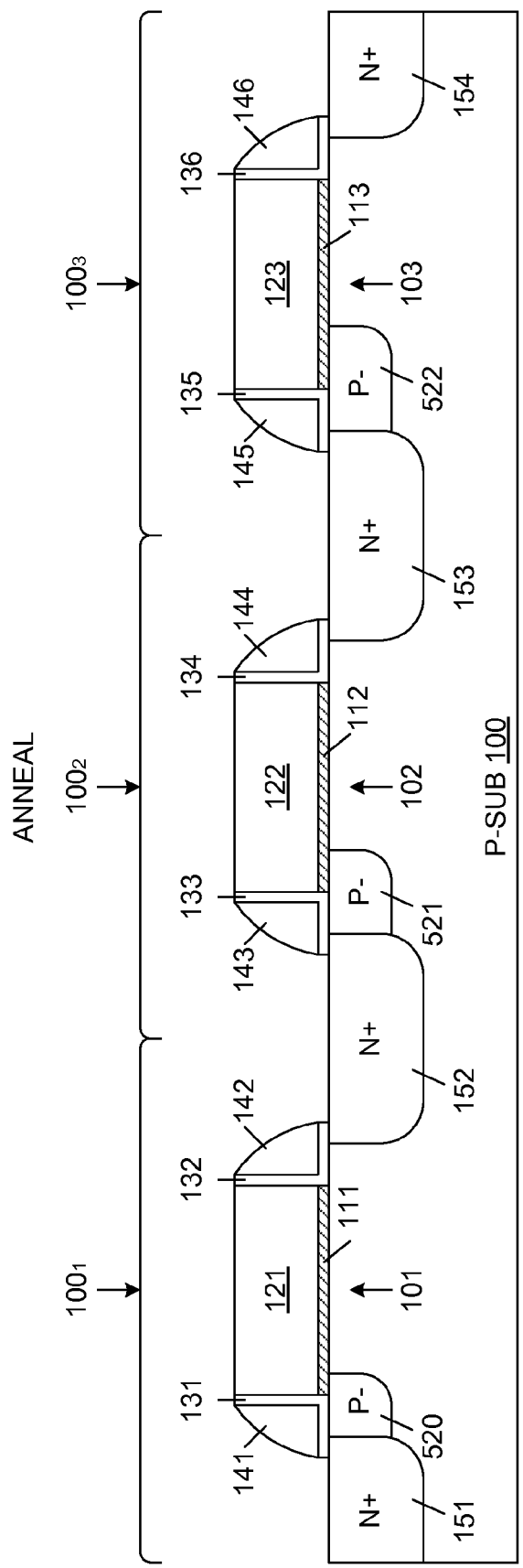

FLASH-TO-ROM CONVERSION

FIELD OF THE INVENTION

This invention relates to cost efficient Flash-to-ROM conversion techniques.

RELATED ART

In many cases, integrated circuits (ICs) with embedded memory need a reliable permanent storage of the program code, which is not supposed to be changed during the product lifetime. Nevertheless, during the development phase of an ASIC with an embedded read only memory (ROM), there are several steps that take place before the final program code is tuned and finalized.

During IC design, embedded Flash processes are often used to facilitate code debugging. After all the hardware and software bugs are fixed and the product is mature and requires no further code modification, it is customary to reduce production costs by converting the Flash memory into mask ROM. This procedure is known as Flash-to-ROM conversion. Additional benefits of Flash-to-ROM conversion include improved data retention and shorter time-to-market.

It usually takes a significant amount of time to implement a Flash-to-ROM conversion because the Flash memory technologies and ROM technologies are different. As a result, the peripheral circuitry must be re-designed, and testing must be revised. Consequently, the Flash-to-ROM conversion is expensive and time consuming.

Conventional Flash-to-ROM conversion techniques use an external Flash memory chip or integration of Flash by different technology. Conventional attempts to perform a Flash-to-ROM conversion with minimum changes to the embedded Flash cells and array organization have been somewhat successful only for arrays that implement Flash cells that include both select transistors and storage transistors (i.e., cells having two transistors), and therefore feature rather large cells, thus making the idea impractical for large scaled down arrays.

The combination of EEPROM cells with one-time-programmable (OTP) cells is known in non-volatile memory (NVM) technology. For example, U.S. Pat. No. 7,402,482 to Weiner (hereinafter "Weiner") discloses a process that can be used to fabricate both EEPROM cells and read-only memory (ROM) elements. The mask set used to form the EEPROM cells is also used to form the ROM elements, such that the EEPROM cells and ROM elements have the same layout area. Each ROM element includes a select transistor and a ROM transistor, so the layout of these cells is undesirably large. To program a ROM element to a first logic state (e.g., logic '0'), the associated ROM transistor is prevented from receiving a buried re-diffusion, such that the ROM transistor is in a permanently closed (no current) state. To program a ROM element to a second logic state (e.g., logic '1'), the associated ROM transistor is fabricated to include a buried n-diffusion, such that the ROM transistor is in a permanently open (source and drain shorted) state. Weiner therefore enables rows of ROM elements and rows of EEPROM cells to be fabricated on the same chip. However, Weiner does not facilitate a Flash-to-ROM process, because the expensive EEPROM technology is still used to form the ROM elements.

U.S. Pat. No. 6,822,286 to Hsu et al. (hereinafter "Hsu") describes a Flash-to-ROM conversion based on a dual-transistor memory unit that includes two PMOS transistors. When the memory unit is selected to permanently store logic data '1', a predetermined dosage of P+ type impurities are implanted into the channel region of one of the two PMOS transistors, thereby transforming this PMOS enhancement mode transistor into a depletion mode transistor. Memory units selected to permanently store logic data '0' are prevented from receiving the above-described P+ type impurities, such that the PMOS transistors in these memory units operate as enhancement mode transistors. In an alternate embodiment, memory units representing logic data '1' are fabricated such that one of the two PMOS transistors has no gate. P type impurities are directly implanted into the channel region associated with the 'canceled' gate, thereby forming a resistor. Memory units representing logic data '0' are fabricated such that both PMOS transistors have gates.

However, the memory cell proposed by Hsu is only suitable for memory units that include select transistors (i.e., two (or more) transistors per memory unit). The size of a two-transistor cell fabricated in accordance with conventional 0.18 micron design rules is approximately 1.9 microns$^2$, which is undesirably large for a ROM cell. In addition, there is no option to change the programmed OTP code, thus making conversion to ROM process complicated.

Versions of mask ROM fabricated using a reverse read-out principle have been described in U.S. Pat. No. 6,030,871 to Eitan (hereinafter "Eitan"), and U.S. Pat. No. 6,468,869 to Yang et al. (hereinafter "Yang"). In Eitan, the bit lines of a cross-wise memory array are first patterned, and a code mask is subsequently formed over selected bit lines. An implant is then performed at a large angle, thereby forming a pocket implant on one side of each cell exposed by the code mask. Yang discloses a similar idea, wherein bit lines are stepped aside from a future channel of the memory cell, and an N+ implant is used to connect the bit lines of selected memory cells within the channel.

Both Eitan and Yang undesirably require a complicated NROM-like technology that requires special masks for patterning the bit lines, and also requires special oxides and special etch procedures. NROM technology and array organization (bit lines orthogonal to polysilicon word lines) is not attractive for Flash-to-ROM conversion because many additional masks and process steps are needed, and the array periphery (i.e., read-out circuits) must be changed to implement the Flash-to-ROM conversion. It would therefore be desirable to have an efficient Flash-to-ROM conversion procedure, which overcomes the above-described deficiencies of conventional Flash-to-ROM procedures.

SUMMARY

Accordingly, the present invention provides an improved approach for implementing embedded memories in application specific ICs (ASICs). This approach includes code verification and fixing using a low-cost, one-transistor per memory cell, Flash memory structure, with further transformation to a mask ROM. The Flash memory structure can be implemented, for example, by an S-Flash memory cell or a Y-Flash memory cell. Both S-Flash and Y-Flash memory cells have record sizes (maximum memory density) in their classes. Each memory cell features from one to four bits of information in different embodiments. No changes in the mask set of the product (except for one coding mask, which is automatically generated in accordance with the final code) are needed.

In accordance with a first embodiment, an S-Flash memory cell is converted to a ROM cell (hereinafter an "S-ROM cell") by introducing a threshold voltage implant into the channel region of the S-Flash memory cell to cause the resulting S-ROM cell to have a relatively high threshold voltage (i.e., store a first logic state), or preventing the threshold voltage implant from being introduced into the channel region of the S-Flash memory cell to cause the resulting S-ROM cell to have a relatively low threshold voltage (i.e., store a second logic state).

In accordance with a second embodiment, an S-Flash memory cell is converted to an S-ROM cell by introducing a threshold voltage implant into a substrate region in alignment with an edge of the gate electrode of the S-Flash memory cell. The threshold voltage implant region extends under the gate electrode, and also extends under a charge storage structure formed at the sidewall of the gate electrode. The threshold voltage implant region increases the threshold voltage of a reverse read operation performed in the S-ROM cell, thereby indicating a first logic state. The threshold voltage implant region is prevented from being introduced into the substrate region to indicate a second logic state.

In accordance with a third embodiment, the width of the mask through which the threshold voltage implant of the second embodiment is performed is varied, thereby allowing the threshold voltage implant region to have different dopant concentrations, thereby allowing multiple bits to be represented by the S-ROM cell.

In accordance with a fourth embodiment, a Y-flash memory cell is converted to a ROM cell (hereinafter a "Y-ROM cell") by adjusting the length of a floating gate extension region of the Y-Flash memory cell. Shorter floating gate extension regions result in Y-ROM cells having a higher threshold voltage.

The present invention will be more fully understood in view of the following description and drawings.

BRIEF DESCRIPTION OF THE DRAWINGS

FIGS. 3A, 3B, 3C, 3D, 3E and 3F are cross sectional views illustrating a Flash-to-ROM conversion of the S-flash memory cells of FIG. 1 in accordance with a first embodiment of the present invention.

FIGS. 4A, 4B, 4C and 4D are cross sectional views illustrating a Flash-to-ROM conversion of the S-flash memory cells of FIG. 1 in accordance with a second embodiment of the present invention.

FIGS. 5A, 5B, 5C and 5D are cross sectional views illustrating a Flash-to-ROM conversion of the S-flash memory cells of FIG. 1 in accordance with a third embodiment of the present invention.

DETAILED DESCRIPTION

High bit count, inexpensive multi-time programmable (MTP) memories having deep submicron non-volatile memory (NVM) cell sizes are not available in existing NVM portfolios. Nevertheless, cheap single transistor memory cell solutions exist that allow very dense arrays, but have technological or operational limitations (e.g., limited number of program/erase cycles, high program currents, limited data retention, disturb issues and/or yield problems). The present specification proposes Flash-to-ROM conversion in memory arrays, without select transistors in the NVM cells. The present invention uses two embedded memory technologies, namely S-Flash and Y-Flash. S-Flash memory technology is described in more detail in U.S. Pat. No. 7,227,234 to Roizin et al. (hereinafter Roizin '234) and U.S. Pat. No. 7,482,233 to Roizin et al. (hereinafter Roizin '233), which are hereby incorporated by reference in their entirety. Y-Flash memory technology is described in more detail in U.S. Pat. No. 7,800,156 to Roizin et al. (hereinafter Roizin '156), which is hereby incorporated by reference in its entirety.

In general, S-Flash and Y-Flash memory cells are fabricated using a conventional CMOS process flow, which also allows for the fabrication of high voltage logic transistors and low voltage logic transistors. The high voltage logic transistors have wider channels, thicker gate oxide layers, and a different lightly doped drain (LDD) implant than the low voltage logic transistors, as known to those of ordinary skill in the art.

Figure 1:
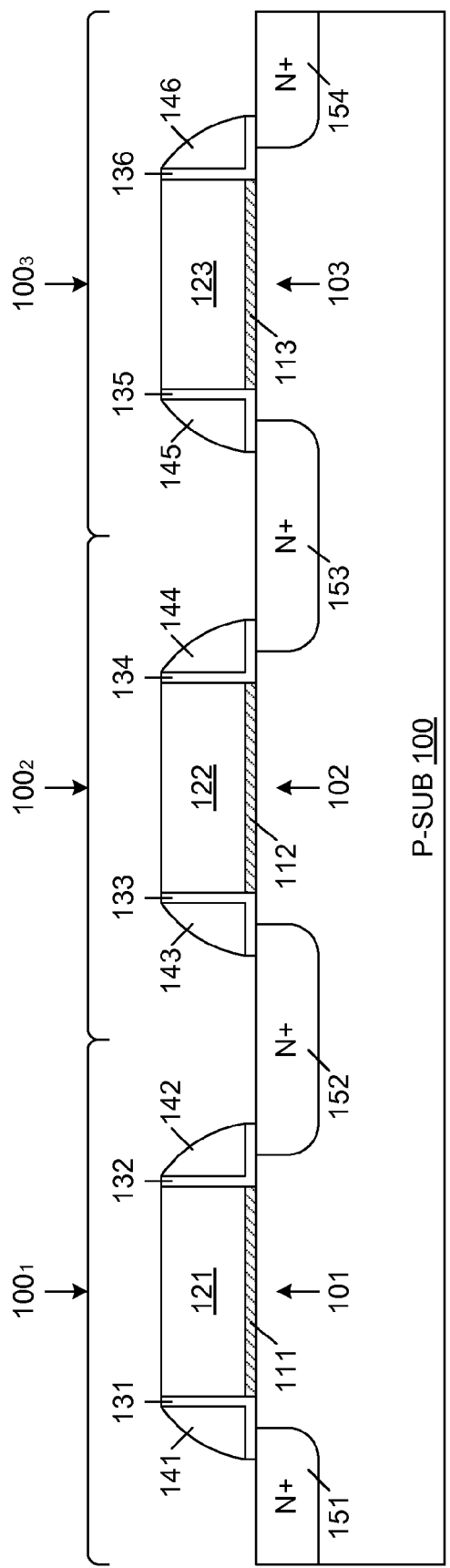
FIG. 1 is a cross sectional view of a plurality of conventional S-flash memory cells.

FIG. 1 is a cross sectional view of a plurality of S-flash memory cells $100_1$-$100_3$, which include p-type semiconductor substrate 100, channel regions 101-103, gate dielectric structures 111-113, gate electrodes 121-123, sidewall dielectric structures 131-136, charge storage structures 141-146 and N+ source/drain regions 151-154. Charge storage structures 141-146 are formed of a material capable of storing electric charge (e.g., silicon-nitride or a nanocrystal containing oxide or any other dielectric material with local storage nodes and/or their combinations that allow charge trapping, e.g., high-k dielectrics). Charges stored by charge storage structures 141-146 adjust the threshold voltages of S-flash memory cells $100_1$-$100_3$.

Figure 2:
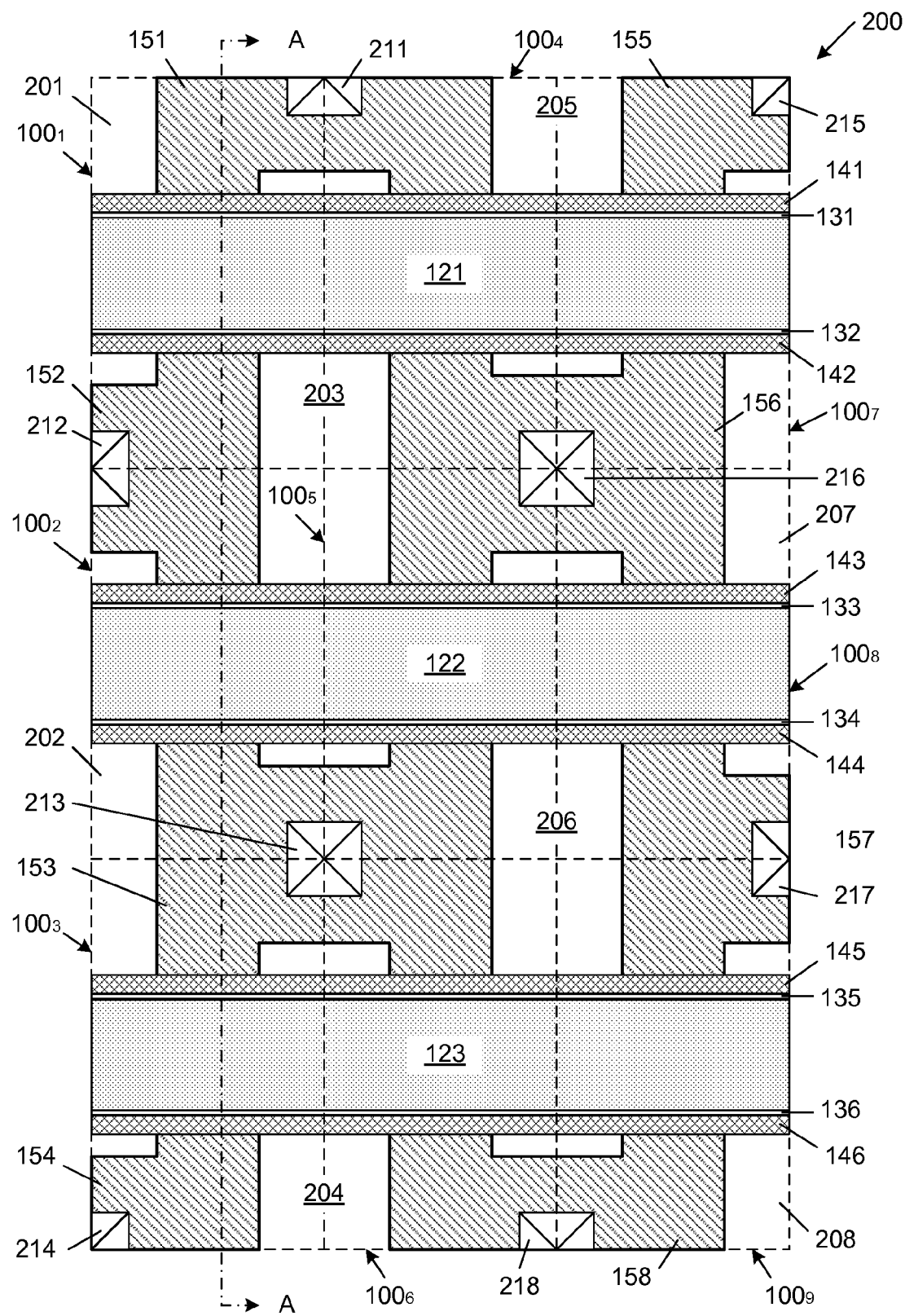
FIG. 2 is a top layout view of an array of conventional S-flash memory cells.

FIG. 2 is a top view of a 3×3 array 200 of S-flash memory cells $100_1$-$100_9$. The boundaries of S-flash memory cells $100_1$-$100_9$ are represented by dashed lines in FIG. 2. Note that the cross-sectional view of FIG. 1 is represented by section line A-A of FIG. 2. Array 200 includes field dielectric regions 201-208 and contacts 211-218. Bit lines (not shown) connect the vertically aligned contacts. Thus, a first bit line connects contacts 212 and 214, a second bit line connects contacts 211 and 213, a third bit line connects contacts 216 and 218, and a fourth bit line connects contacts 215 and 217.

In general, S-flash memory cell $100_1$ operates as follows. S-flash memory cells $100_2$-$100_9$ operate in the same manner as S-flash memory cell $100_1$. Charge storage structure 131 is programmed by applying a programming voltage pulse of about 5 Volts to the gate electrode 121 and the source/drain region 151, and a voltage of about 0 volts to the source/drain region 152. Under these conditions, channel hot electrons (CHE) are generated, and travel from source/drain region 152 through channel region 105 toward source/drain region 151. These hot electrons enter, and are stored by, charge storage structure 141.

Charge storage structure 141 is erased by applying an erase voltage of −5 Volts to the gate electrode 121 and source/drain region 151, and a voltage of 5-6 Volts to source/drain region 152. Under these conditions, band-to-band tunneling (BBT) holes are generated by the lateral electric field and stored by charge storage structure 141. Charge storage structure 142 is programmed and erased in a similar manner as charge storage structure 141 (reversing the source/drain voltages).

The status of the charge stored by charge storage structure 141 can be determined by performing a reverse read operation, wherein a suitable read voltage (e.g., 3.5 Volts) is applied to gate electrode 121, and a higher voltage is applied to source/drain region 152 than to source/drain region 151. For example, source/drain regions 151 and 152 can be held at 0 Volts and 1.6 Volts, respectively. When biased in this manner, if charge storage structure 141 has been programmed, a relatively low drain current will flow through S-Flash memory cell $100_1$, thereby indicating that charge storage structure 141 is in a programmed state. Conversely, if charge storage structure 141 has been erased, a relatively high drain current will flow through S-flash memory cell $100_1$, thereby indicating that charge storage structure 141 is in an erased state. Charge storage structure 142 is read in a similar manner (reversing the source/drain voltages).

First Embodiment

In accordance with a first embodiment of the present invention, a Flash-to-ROM conversion is implemented by modifying a method used to fabricate S-flash memory cell array 200. In general, a threshold voltage (VT) implant is introduced into the channel regions of S-flash cells that are to have a first logic state (i.e., are 'programmed' to have a high threshold voltage) as a result of the Flash-to-ROM conversion, while the threshold voltage implant is prevented from entering the channel regions of S-flash cells that are to have a second logic state (i.e., have a low threshold voltage) as a result of the Flash-to-ROM conversion.

FIGS. 3A-3F are cross sectional views that illustrate a Flash-to-ROM conversion of S-flash memory cells $100_1$, $100_2$ and $100_3$ into S-ROM cells in accordance with the first embodiment. In the example represented by FIGS. 3A-3F, S-flash memory cell $100_1$ is programmed to have a high threshold voltage, while S-flash memory cells $100_2$ and $100_3$ remains un-programmed, and therefore exhibit relatively low threshold voltages.

As illustrated by FIG. 3A, a threshold voltage (VT) code mask 301 is formed over p-type substrate 101, wherein the code mask 301 includes an opening over the channel region of each S-flash memory cell to be programmed to have a high threshold voltage. In the illustrated example, the VT code mask 301 includes an opening 302 located over the channel region 101 of the S-ROM memory cell $100_1$, which is to be programmed to a high threshold voltage. A threshold voltage code implant is performed through VT code mask 301, whereby p-type impurities are implanted into opening 302. In accordance with one embodiment, the VT code implant is performed by implanting $BF_2$ at an energy of about 20 keV and a dosage of about $10^{14}$ cm$^{-2}$. As a result, a region 310 containing p-type impurities (hereinafter "p– region 310") is introduced to the channel region 101 of S-ROM memory cell $100_1$.

As illustrated by FIG. 3B, the VT code mask 301 is removed, and gate dielectric 315 is formed over the upper surface of substrate 100. In accordance with one embodiment, gate dielectric 315 is silicon oxide, which is thermally grown to a thickness of about 70 Angstroms. However, it is understood that gate dielectric 315 can have other thicknesses and/or compositions in other embodiments. In the described example, the gate dielectric 315 used to form the S-ROM memory cells is the same gate dielectric used to fabricate high voltage logic transistors on the same substrate 100. A layer of conductively doped polysilicon is then formed over gate dielectric 315. This polysilicon layer is patterned (e.g., using a photoresist mask) to form gate electrodes 121-123. Note that gate electrode 121 is located over p– region 310, as illustrated.

The polysilicon layer used to form gate electrodes 121-123 can also be used to form gate electrodes of conventional logic transistors (not shown), which are fabricated on substrate 100. After these gate electrodes are formed, a lightly doped drain (LDD) implant is performed, thereby forming LDD regions in the conventional logic transistors, which are aligned with the edges of the gate electrodes. Note that an LDD mask (not shown) is used to prevent this LDD implant from reaching S-ROM memory cells $100_1$-$100_9$.

As illustrated by FIG. 3C, the portions of gate dielectric 315 not covered by polysilicon gate electrodes 121-123 are removed in a manner known to those of ordinary skill in the art. A sidewall dielectric layer 320 is then formed over the resulting structure. In accordance with one embodiment, sidewall dielectric layer 320 is TEOS having a thickness of about 200 Angstroms. In this embodiment, the same sidewall dielectric layer 320 is also used in the formation of conventional logic transistors (not shown), which are fabricated on the same substrate 100. Note that when S-flash memory cells are formed on the same substrate as conventional logic transistors, the conventional logic transistors are typically formed with a sidewall dielectric layer having a first composition and thickness (e.g., TEOS having a thickness of about 200 Angstroms), while the S-flash memory cells are formed with a sidewall dielectric layer having a second composition and thickness (e.g., thermally grown silicon oxide having a thickness of about 80 Angstroms). (See, e.g., U.S. Pat. No. 7,227,234 to Roizin et al.) The Flash-to-ROM conversion of the present embodiment enables both the S-ROM memory cells and the logic transistors to use the same sidewall dielectric layer, thereby simplifying the process required by the Flash-to-ROM conversion.

A layer of charge storage material is formed over sidewall dielectric layer 320. In accordance with one embodiment, charge storage material layer is formed, e.g., by depositing silicon nitride to a thickness of about 600 to 1000 Angstroms in a low pressure thermal CVD system from dichlorosilane ($SiH_2Cl_2$) and ammonia at 770° C. using a gas ratio of 1/10. The layer of charge storage material and sidewall dielectric layer 320 are then etched back using well known techniques, thereby forming charge storage structures 141-146 and sidewall dielectric structures 131-136 as illustrated by FIG. 3D.

Figure 3E:
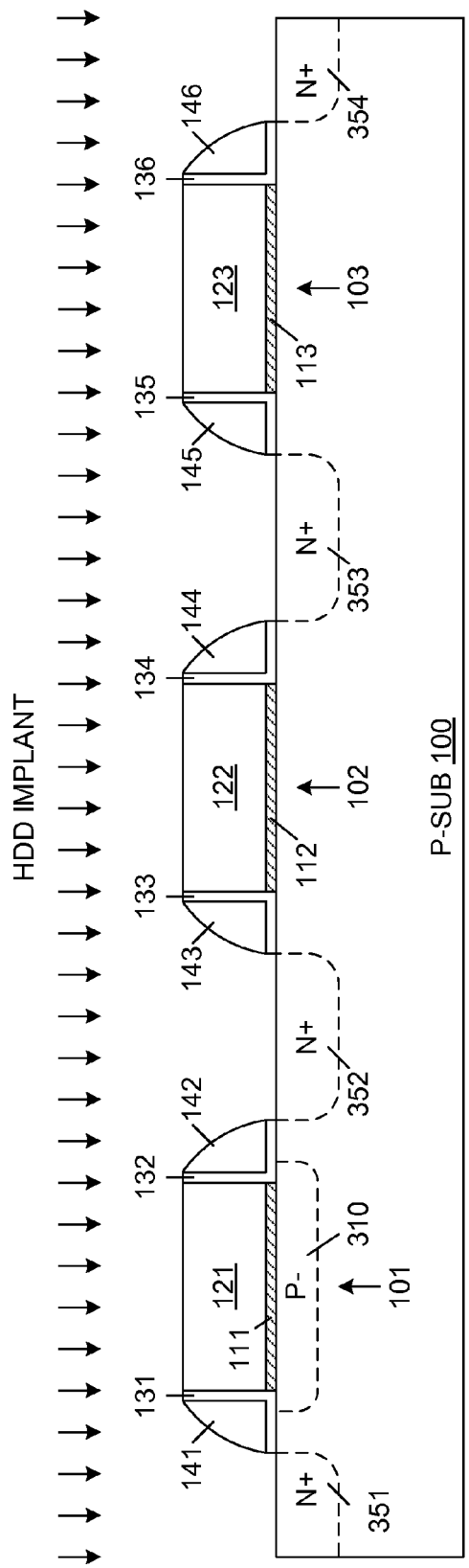

As illustrated by FIG. 3E, a heavily doped drain (HDD) implant is performed, whereby n-type impurities are implanted into substrate 100. In one embodiment, the HDD implant is implemented, e.g., by implanting As at a dosage of $5*10^{15}$ cm$^{-2}$ and an energy of 50 keV. The HDD implant results in the formation of N+ regions 351-354 in semiconductor substrate 100, wherein these N+ regions 351-354 are aligned with the edges of charge storage structures 141-146, as illustrated. Note that this HDD implant also results in the formation of N+ source/drain contact regions in the conventional logic transistors fabricated on the same substrate 100.

Figure 3F:
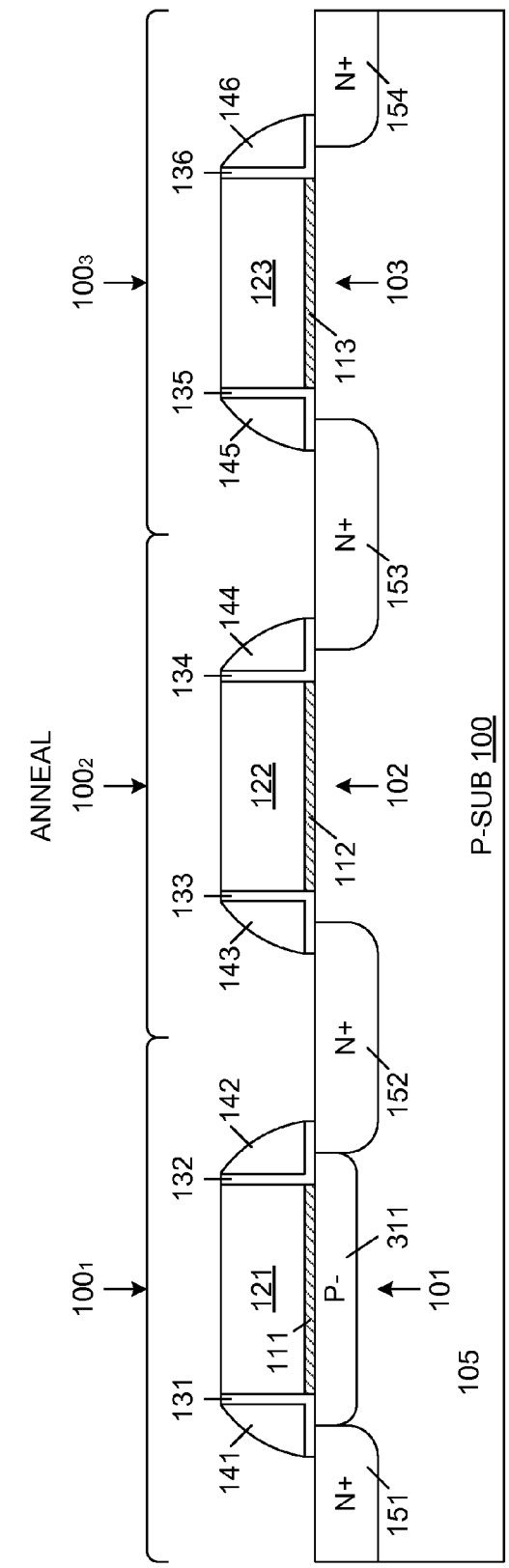

As illustrated by FIG. 3F, an anneal is then performed, thereby forming heavily doped N+ source/drain regions 151-154 and P– channel region 311. The doped P– channel region of S-ROM memory cell $100_1$ causes the threshold voltage of this memory cell $100_1$ to be higher than the threshold voltages of S-flash memory cells $100_2$ and $100_3$. As a result, the logic state of S-flash memory cell $100_1$ can be distinguished from the logic states of S-flash memory cells $100_2$ and $100_3$ during read accesses to these memory cells. That is, applying predetermined read voltages to memory cell $100_1$ will result in no/minimal read current flowing through this memory cell, while applying the same read voltages to memory cells $100_2$ and $100_3$ will result in greater read currents flowing through these memory cells. In this manner, the threshold voltage implant of FIG. 3A implements a Flash-to-ROM conversion in accordance with the first embodiment of the present invention.

Second Embodiment

In accordance with a second embodiment of the present invention, a Flash-to-ROM conversion is implemented by using separate threshold voltage code implants for programming both sides (i.e., both bits) of an S-Flash memory cell. FIGS. 4A-4D are cross sectional views that illustrate a Flashto-ROM conversion of S-flash memory cells $100_1$-$100_3$ in accordance with the second embodiment of the present invention. In the example represented by FIGS. 4A-4D, the left-side bits of S-flash memory cells $100_1$ and $100_2$ (i.e., the bits associated with charge storage regions 141 and 143 in memory cells $100_1$ and $100_2$) and the right-side bit of S-flash memory cell $100_3$ (i.e., the bit associated with charge storage region 146 in memory cell $100_3$) are each programmed to have a high threshold voltage. The right-side bits of S-flash memory cells $100_1$ and $100_2$ and the left-side bit of S-flash memory cell $100_3$ remain non-programmed, and exhibit a relatively low threshold voltage. Although the left-side bits of S-Flash memory cells $100_1$ and $100_2$ and the right-side bits of S-Flash memory cell $100_3$ are programmed in the illustrated example, it is understood that any combination of the left-side and right-side bits of the S-flash memory cells $100_1$-$100_3$ can be programmed in other embodiments, depending on the values to be programmed in the Flash-to-ROM conversion. It is also understood that S-flash memory cells $100_4$-$100_9$ are programmed at the same time as S-flash memory cells $100_1$-$100_3$.

As illustrated by FIG. 4A, the gate dielectric 315 and the polysilicon gate electrodes 121-123 are formed over p-type substrate 101 in the manner described above in connection with FIG. 3B. A threshold voltage (VT) code mask 401 is formed over the resulting structure, wherein the code mask 401 includes an opening that exposes the bit location to be programmed to a high threshold voltage. In the illustrated example, the VT code mask 401 includes openings 402-404, which expose the locations where charge storage structures 141, 143 and 146 will subsequently be formed in S-flash memory cells $100_1$, $100_2$ and $100_3$, respectively. A threshold voltage code implant is performed through VT code mask 401, whereby p-type impurities are implanted into openings 402-404. This code implant can be performed at various angles (tilt) from 0 degrees (i.e., perpendicular to the upper surface of substrate 101) to 45 degrees (like a pocket implant). In accordance with one embodiment, the VT code implant is performed by implanting $BF_2$ at an angle of about 7° (to reduce channeling effects), an energy of about 15 keV and a dosage of about 5E13 to 2E14 cm$^{-2}$. In another embodiment, the implantation angle can be increased to an angle in the range of about 15° to 45° and a dosage of 2E13 to 3E14 cm$^{-2}$. As a result, regions 410, 411 and 412 containing p-type impurities (hereinafter 'p– regions 410, 411 and 412') are formed at the edges of channel regions 101, 102 and 103 of S-ROM memory cells $100_1$, $100_2$ and $100_3$, as illustrated.

Figure 4B:
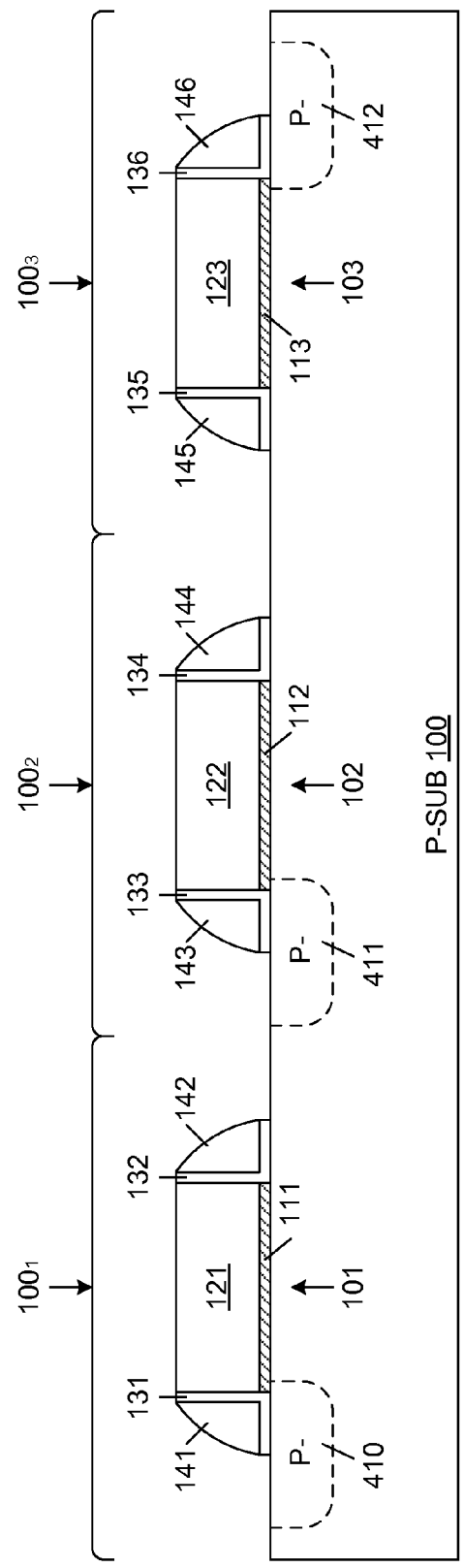

As illustrated in FIG. 4B, the code mask 401 is removed. Sidewall dielectric structures 131-136 and charge storage structures 141-146 are then formed in the manner described above in connection with FIGS. 3C and 3D.

Figure 4C:
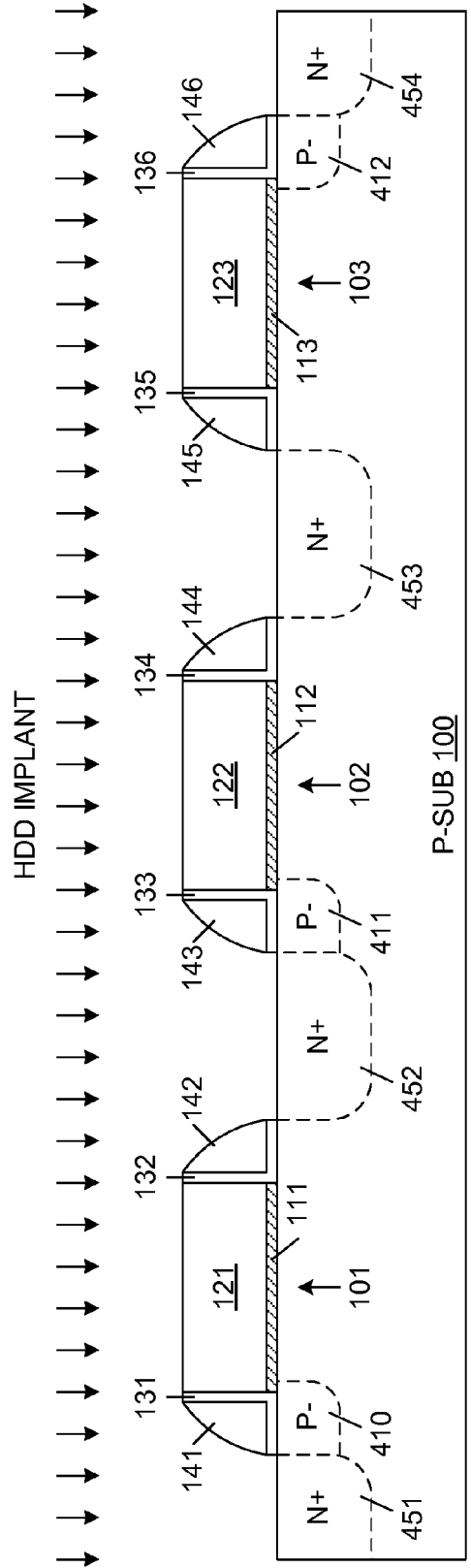

As illustrated in FIG. 4C, a heavily doped drain (HDD) implant is performed, whereby n-type impurities are implanted into substrate 100. In one embodiment, the HDD implant is implemented by implanting As at a dosage of 5*10$^{15}$ cm$^{-2}$ and an energy of 50 keV. The HDD implant results in the formation of N+ regions 451-454 in semiconductor substrate 100, wherein these N+ regions 451-454 are aligned with the edges of charge storage structures 141-146, as illustrated. Note that this HDD implant also results in the formation of N+ regions in the conventional logic transistors.

Figure 4D:
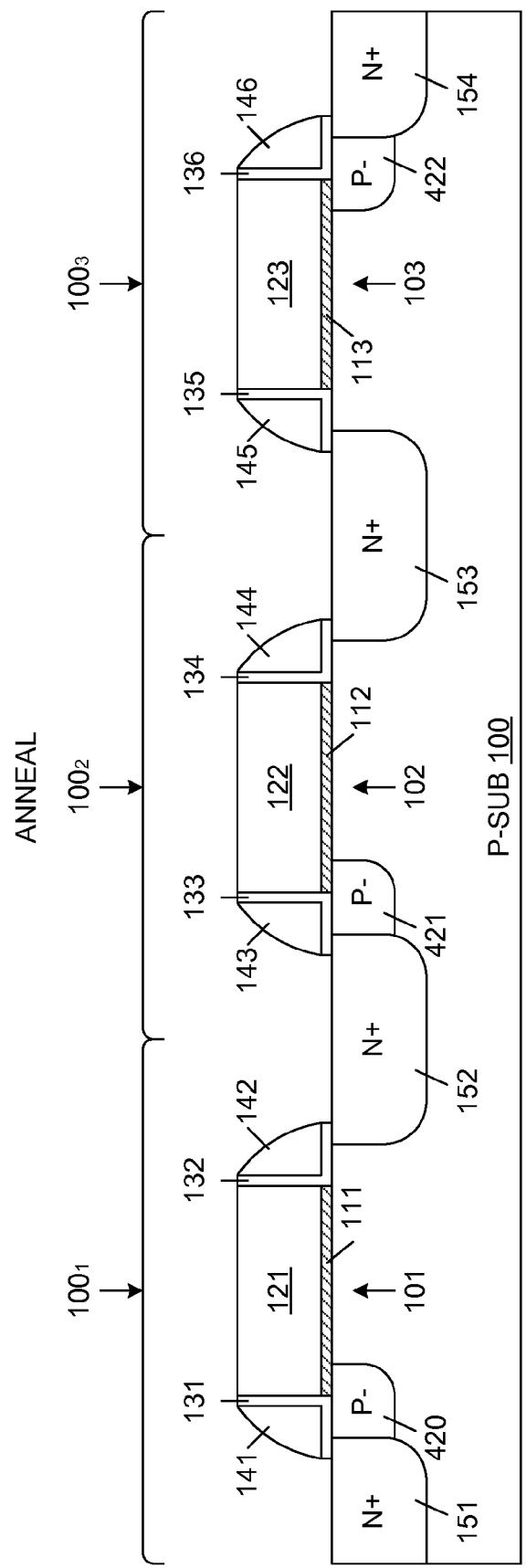

As illustrated by FIG. 4D, an anneal is then performed, thereby forming heavily doped N+ source/drain regions 151-154 and P– regions 420, 421 and 422.

P– region 420 causes the threshold voltage of the left-side bit of memory cell $100_1$ to be higher than the threshold voltage of the right-side bit of memory cell $100_1$. Similarly, P– region 421 causes the threshold voltage of the left-side bit of memory cell $100_2$ to be higher than the threshold voltage of the right-side bit of memory cell $100_2$. P– region 422 causes the threshold voltage of the right-side bit of memory cell $100_3$ to be higher than the threshold voltage of the left-side bit of memory cell $100_3$. As a result, the logic states of the left-side bits of S-flash memory cells $100_1$ and $100_2$ and the logic state of the right-side bit of S-flash memory cell $100_3$ can be distinguished from the logic states of the right-side bits of S-flash memory cells $100_1$ and $100_2$ and the logic state of the right-side bit of S-flash memory cell $100_3$ during read accesses to these memory cell bits. In this manner, the threshold voltage implant of FIG. 4A implements a Flash-to-ROM conversion in accordance with the second embodiment of the present invention.

Table 1 illustrates the threshold voltages measured in a reverse read-out mode for an S-flash memory cell having a silicon oxide gate dielectric with a thickness of 70 Angstroms, a channel length of 0.3 microns, and a coding implant at an angle of 7 degrees.

TABLE 1

| Implant Energy | Implant Dose ($BF_2$ cm$^{-2}$) | Threshold Voltage |
|---|---|---|
| No Implant | — | 0.9 V |
| 15 keV | $4 \times 10^{13}$ | 2.7 V |
| 15 keV | $6 \times 10^{13}$ | 3.6 V |
| 15 keV | $8 \times 10^{13}$ | 4.5 V |
| 15 keV | $10^{14}$ | 5.6 V |
| 20 keV | $10^{14}$ | 4.2 V |
| 25 keV | $10^{14}$ | 3.3 V |

As illustrated by Table 1, the threshold voltage is easily tuned by adjusting the $BF_2$ implant dose in the range of $10^{13}$ to $10^{14}$ cm$^{-2}$. Optimum energy is less than or equal to about 15 keV. For larger energies, the implant may be too deep to cause efficient increase of the threshold voltage.

Third Embodiment

In accordance with a third embodiment of the present invention, the width of the threshold voltage coding mask is modified to program each bit to different threshold voltage levels, thereby enabling each storage structure to represent multiple bits using multiple threshold voltage levels. Four bits per cell may be challenging for high-volume (tens of Mbits and above) embedded memories. In accordance with the third embodiment, the width of the opening of the threshold voltage coding mask can have three different widths, thereby allowing each bit to be programmed to four distinct levels (including non-programmed). Even with a maximum misalignment of 0.1 microns (actual values are lower in the production 0.18 micron process flow), the actual sizes of the openings in the threshold voltage code mask are distinguished by providing for 0.3, 0.55 and 0.8 micron openings. Taking into account an almost 5 Volt memory window for $10^{14}$/cm$^{-2}$ and 15 keV implant (see, Table 1), a 4 bit/cell (two bits at each S-ROM transistor side) is feasible.

FIGS. 5A-5D are cross sectional views that illustrate a Flash-to-ROM conversion of S-flash memory cells $100_1$-$100_3$ in accordance with the third embodiment of the present invention. In the example represented by FIGS. 5A-5D, the left-side bits of S-flash memory cells $100_1$, $100_2$ and $100_3$ (i.e., the bits associated with charge storage regions 141, 143 and 145 in memory cells $100_1$, $100_2$ and $100_3$) are each programmed to have a successively higher threshold voltages. The right-side bits of S-flash memory cells $100_1$-$100_3$ remain non-programmed, and exhibit a relatively low threshold voltage.

Although the left-side bits of S-Flash memory cells $100_1$-$100_3$ are programmed in the illustrated example, it is understood that any combination of the left-side and right-side bits of the S-flash memory cells $100_1$-$100_3$ can be programmed in other embodiments, depending on the values to be programmed in the Flash-to-ROM conversion. It is also understood that S-flash memory cells $100_4$-$100_9$ are programmed at the same time as S-flash memory cells $100_1$-$100_3$.

As illustrated by FIG. 5A, the gate dielectric 315 and the polysilicon gate electrodes 121-123 are formed over p-type substrate 101 in the manner described above in connection with FIG. 3B. A threshold voltage (VT) code mask 501 is formed over the resulting structure, wherein the code mask 501 includes openings that expose the bit locations to be programmed to a high threshold voltage. In the illustrated example, the VT code mask 501 includes openings 502-504, which expose the locations where charge storage structures 141, 143 and 145 will subsequently be formed in S-flash memory cells $100_1$, $100_2$ and $100_3$, respectively. Openings 502, 503 and 504 have different widths W1, W2 and W3, respectively. In the illustrated example, W3>W2>W1.

As described in more detail below, the wider the width of the opening in code mask 501, the higher the threshold voltage of the associated bit. In accordance with one embodiment, width W1 is about 0.2 to 0.4 microns, width W2 is about 0.45 to 0.65 microns and width W3 is about 0.7 to 0.9 microns. In a particular embodiment, width W1 is about 0.3 microns, width W2 is about 0.55 microns and width W3 is about 0.8 microns. A threshold voltage code implant is performed through VT code mask 501, whereby p-type impurities are implanted into openings 502-504. This implant can be performed in using the various parameters described above in connection with FIG. 4B. As a result, regions 510, 511 and 512 containing p− type impurities (hereinafter "p− regions 510, 511 and 512") are formed at the edges of channel regions 101, 102 and 103 of S-flash memory cells $100_1$, $100_2$ and $100_3$, as illustrated. Because W3>W2, the amount of impurities implanted into p− region 512 is greater than the amount of impurities implanted into p− region 511. This relationship is represented in FIG. 5A by showing that p− region 512 extends further under gate electrode 123 than p− region 511 extends under gate electrode 122 (even though this physical relationship may not actually exist). Similarly, because W2>W1, the amount of impurities implanted into p− region 511 is greater than the amount of impurities implanted into p− region 510. This relationship is represented in FIG. 5A by showing that p− region 511 extends further under gate electrode 122 than p− region 510 extends under gate electrode 121 (even though this physical relationship may not actually exist).

As illustrated in FIG. 5B, the code mask 501 is removed. Sidewall dielectric structures 131-136 and charge storage structures 141-146 are then formed in the manner described above in connection with FIGS. 3C and 3D.

As illustrated in FIG. 5C, a heavily doped drain (HDD) implant is performed, whereby n-type impurities are implanted into substrate 100. In one embodiment, the HDD implant is implemented by implanting As at a dosage of $5*10^{15}$ and an energy of 50 keV. The HDD implant results in the formation of N+ regions 551-554 in semiconductor substrate 100, wherein these N+ regions 551-554 are aligned with the edges of charge storage structures 141-146, as illustrated. Note that this HDD implant also results in the formation of N+ regions in the conventional logic transistors.

As illustrated by FIG. 5D, an anneal is then performed, thereby forming heavily doped N+ source/drain regions 151-154 and P− regions 520, 521 and 522.

P− region 520 causes the threshold voltage of the left-side bit of memory cell $100_1$ to be higher than the threshold voltage of the right-side bit of memory cell $100_1$. For example, the reverse read threshold voltage of the left-side bit of memory cell $100_1$ may be about 1.6 Volts, while the reverse read threshold voltage of the right-side bit of memory cell $100_1$ may be about 0.9 Volts.

P− region 521 causes the threshold voltage of the left-side bit of memory cell $100_2$ to be higher than the threshold voltage of the left-side bit of memory cell $100_1$. For example, the reverse read threshold voltage of the left-side bit of memory cell $100_2$ may be about 2.3 Volts.

P− region 522 causes the threshold voltage of the left-side bit of memory cell $100_3$ to be higher than the threshold voltage of the left-side bit of memory cell $100_2$. For example, the reverse read threshold voltage of the left-side bit of memory cell $100_3$ may be about 3 Volts.

As a result, the logic states of the left-side bits of S-ROM memory cells $100_1$, $100_2$ and $100_3$ and the logic state of the right-side bits of S-ROM memory cells $100_1$-$100_3$ can be distinguished from one another during read accesses to these memory cell bits. In this manner, the threshold voltage implant of FIG. 5A implements a Flash-to-ROM conversion in accordance with the third embodiment of the present invention.

Note that the S-ROM cells of the first, second and third embodiments can advantageously be operated using the same read out circuits and other array periphery circuits as the S-Flash memory cells of FIGS. 1-2. S-Flash memory cell technology allows practical arrays up to hundreds of Mbit in 0.18 micron CMOS technology. S-flash memory cells can implement 4-bit/cell operation, wherein four charge levels are used on both sides of the channel to support multi-level charges. Thus, the effective cell size is less than 0.1 microns$^2$ in 0.18 micron CMOS technology.

Fourth Embodiment

Figure 6:
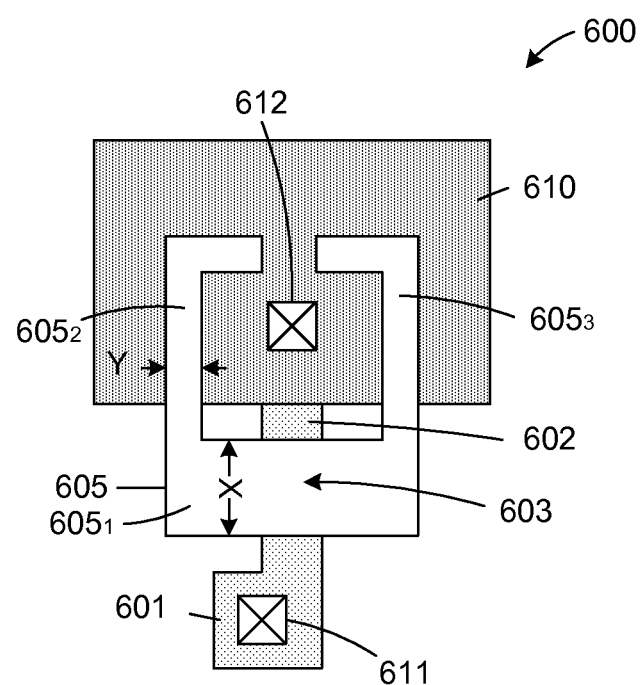
FIG. 6 is a top view of a conventional Y-flash memory cell.

In accordance with a fourth embodiment of the present invention, a conventional Y-flash memory cell is modified to implement a Flash-to-ROM conversion. FIG. 6 is a top view of a conventional Y-Flash memory cell 600, which is described in more detail in U.S. Pat. No. 7,800,156 to Roizin et al., which is hereby incorporated by reference in its entirety. Y-Flash memory cell 600 is fabricated using a conventional CMOS process.

Y-Flash memory cell 600 is fabricated in a p-well region (not shown), and includes source region 601, drain region 602, channel region 603, floating gate electrode 605, drain extension region 610, source contact 611 and drain contact 612. Floating gate electrode 605 is separated from the underlying semiconductor regions by a gate oxide layer (not shown). This gate oxide layer has the same thickness as the gate oxide layers of high voltage CMOS transistors fabricated on the same substrate as Y-flash memory cell 600. For example, the gate oxide layer of Y-flash memory cell 600 may be silicon oxide having a thickness of about 100 Angstroms.

Floating gate electrode 605 includes a first portion $605_1$, which extends over the channel region 603 of Y-flash memory cell 600. This first portion $605_1$ has a width (X) corresponding with the gate width of a high voltage CMOS transistor fabricated on the same substrate as Y-Flash memory cell 600. For example, the first portion $605_1$ may have a width of about 0.35 microns. Floating gate electrode 605 also includes elongated extension portions $605_2$-$605_3$, which extend from the left and right ends of the first portion $605_1$ over drain extension region 610. Each of these extension portions $605_2$-$605_3$ has a width (Y) corresponding with the gate width of a low voltage CMOS transistor fabricated on the same substrate as Y-Flash memory cell 600. For example, the extension portions 605$_2$-605$_3$ may have a width of about 0.14 microns.

During the fabrication of Y-flash memory cell 600, source region 601, drain region 602 and drain extension region 610 all receive the lightly doped drain implant used to fabricate the low voltage CMOS transistors on the same substrate as Y-Flash memory cell 600. This lightly doped drain implant is hereinafter referred to as the low voltage lightly doped drain implant, or LV-LDD implant.

Also during the fabrication of Y-flash memory cell 600, drain extension region 610 receives the lightly doped drain implant used to fabricate the high voltage CMOS transistors on the same substrate as Y-Flash memory cell 600. This lightly doped drain implant is hereinafter referred to as the high voltage lightly doped drain implant, or HV-LDD implant. Based on the relatively small width of the floating gate extension portions 605$_2$-605$_3$ and the relatively high impurity concentration in drain extension region 610, the implanted impurities in drain extension region 610 will merge under floating gate extension portions 605$_2$-605$_3$ after these impurities are activated. This advantageously provides increased capacitance between drain extension region 610 and floating gate extension portions 605$_2$-605$_3$. Note that sidewall spacers (not shown) are then formed adjacent to floating gate electrode 605, and a heavily doped source/drain implant is subsequently performed into the portions of source region 601, drain region 602 and drain extension region 610 that are not covered by the sidewall spacers. Contacts 611 and 612 provide electrical connections to source region 601 and drain extension region 612, respectively.

Y-flash memory cell 600 is programmed by applying a positive programming voltage (e.g., 5.5 Volts) to drain contact 612, while grounding source contact 611. Under these conditions, electrons are injected into floating gate 605 through a channel hot electron (CHE) injection mechanism. As a result, the threshold voltage of Y-flash memory cell 600 increases. The threshold voltage of Y-flash memory cell 600 can be increased by up to about 3 Volts by this programming operation. This programming range allows the Y-flash memory cell 600 to be programmed to three distinct threshold voltages (e.g., by controlling the programming time).

The LV-LDD implant, which is introduced to source region 601 and drain region 602 in the manner described above, contains both arsenic (As) and BF$_2$, wherein the BF$_2$ strongly enhances CHE injection within Y-flash memory cell 600, thereby rendering the Y-flash memory cell 600 programmable.

Y-Flash memory cell is erased by applying the positive programming voltage to source contact 611, while keeping drain contact 612 floating. Under these conditions, holes are introduced to floating gate 605 by a band-to-band tunneling (BBT) mechanism. As a result, the threshold voltage of Y-flash memory cell 600 decreases.

As described above, Y-flash memory cell 600 can be controlled to have one of four distinct threshold voltages through the above described program and erase operations.

In accordance with the fourth embodiment of the present invention, a Flash-to-ROM conversion is implemented by modifying the topology of Y-flash memory cell 600. In general, the floating gate extension regions 605$_2$-605$_3$ are fabricated to different distinct lengths in order to create a memory cell having different threshold voltages. The longer the floating gate extensions 605$_2$-605$_3$ included in the Y-flash memory cell 600, the lower the threshold voltage of the resulting memory cell. Also, to implement the Flash-to-ROM conversion, the source region 601 and the drain region 602 are fabricated with the HV-LDD implant, rather than the LV-LDD implant. The HV-LDD implant is optimized to minimize channel hot electron effects, and thereby ensure threshold voltage stability of the resulting Y-ROM memory cell.

Figure 7:
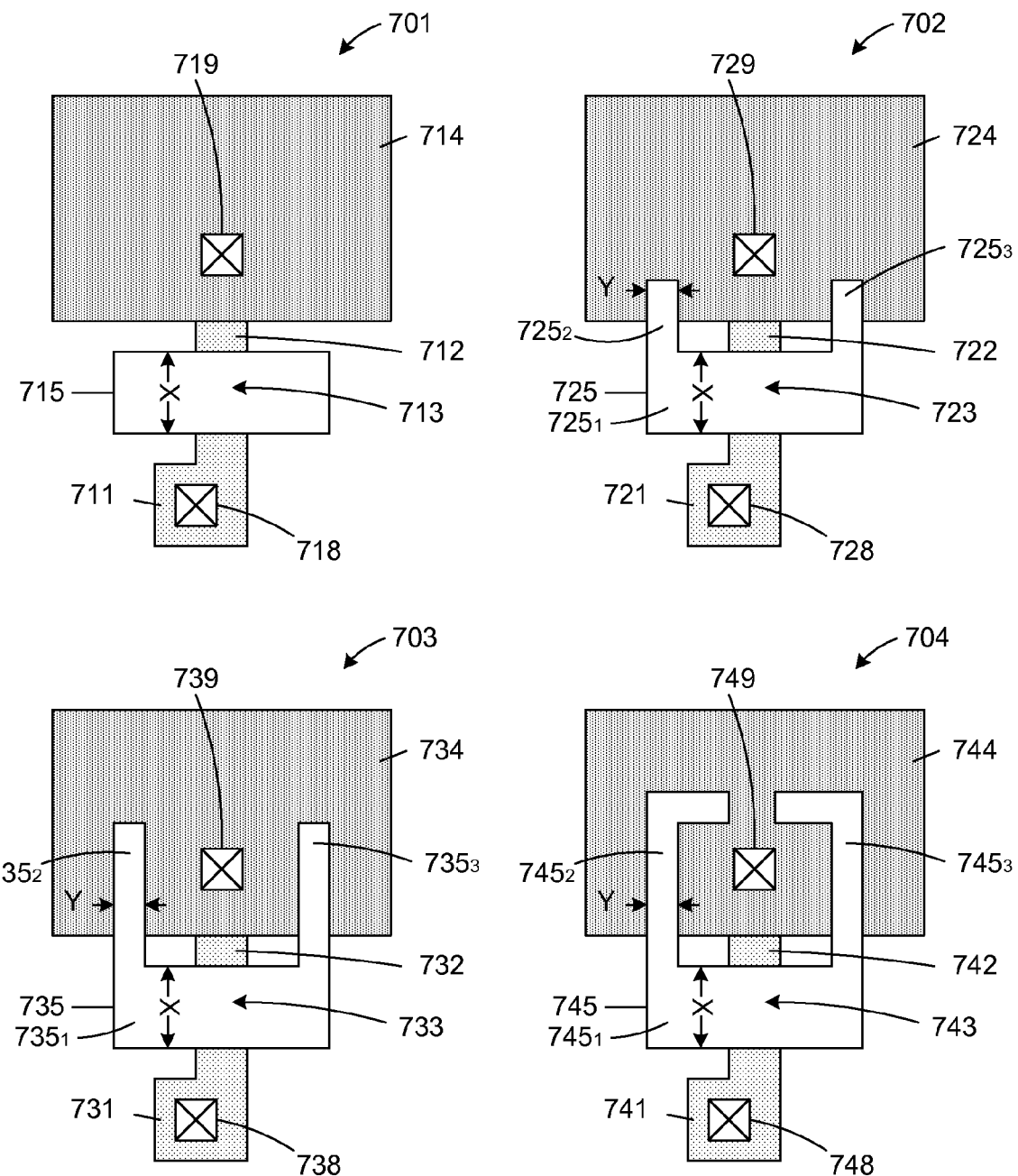
FIG. 7 is a top layout view that illustrates a Flash-to-ROM conversion of the Y-Flash memory cell of FIG. 6 in accordance with a fourth embodiment of the present invention.

FIG. 7 is a top layout view that illustrates Y-ROM memory cells 701-704, which represent a Flash-to-ROM conversion of Y-flash memory cell 600 in accordance with the fourth embodiment. In the example represented by FIG. 7, Y-ROM memory cells 701, 702, 703 and 704 are fabricated to exhibit threshold voltages VT1, VT2, VT3 and VT4, respectively, wherein VT1>VT2>VT3>VT4.

Y-ROM memory cells 701-704 are substantially identical to Y-flash memory cell 600, with differences noted below. Y-ROM memory cells 701, 702, 703 and 704 are fabricated in a p-well region (not shown), and include n-type source regions 711, 721, 731 and 741, respectively, n-type drain regions 712, 722, 732 and 742, respectively, channel regions 713, 723, 733 and 743, respectively, polysilicon floating gate electrodes 715, 725, 735 and 745, respectively, n-type drain extension regions 714, 724, 734 and 744, respectively, source contacts 718, 728, 738 and 748, respectively, and drain contacts 719, 729, 739 and 749, respectively.

Floating gate electrodes 715, 725, 735 and 745 are separated from the underlying semiconductor regions by a gate oxide layer (not shown) having the same thickness as the gate oxide layer of high voltage CMOS transistors fabricated on the same substrate. In the described example, the gate oxide layers of Y-ROM memory cells 701-704 have a thickness of about 100 Angstroms (wherein the gate oxide layer of low voltage CMOS transistors fabricated on the same substrate may have a thickness of about 30 Angstroms).

Floating gate electrode 745 of Y-ROM memory cell 704 is identical to the floating gate electrode 605 of Y-Flash memory cell 600 (FIG. 6). Thus, floating gate electrode 745 has a first portion 745$_1$, which extends over the channel region 743, and has a width (X) corresponding with the gate length of a high voltage CMOS transistor fabricated on the same substrate (e.g., about 0.35 microns). Floating gate electrode 745$_5$ also includes elongated extension portions 745$_2$-745$_3$, which extend from the left and right ends of the first floating gate portion 745$_1$ over drain extension region 744. Each of these extension portions 745$_2$-745$_3$ has a width (Y) corresponding with the gate length of a low voltage CMOS transistor fabricated on the same substrate (e.g., 0.14 microns).

Floating gate electrode 735 of Y-ROM memory cell 703 is similar to the floating gate electrode 745 of Y-ROM memory cell 704, except that floating gate electrode 735 is fabricated such that the distal ends of the elongated extension portions 735$_2$ and 735$_3$ are 'clipped' with respect to those included in Y-ROM memory cell 704. That is, the polysilicon gate mask used to pattern floating gate electrodes 735 and 745 is fabricated such that the extension portions 735$_2$-735$_3$ are smaller (shorter) than the floating gate extension portions 745$_2$-745$_3$. As a result, Y-ROM memory cell 703 exhibits a smaller drain-to-gate capacitive coupling (and therefore a higher threshold voltage) than Y-ROM memory cell 704.

Floating gate electrode 725 of Y-ROM memory cell 702 is similar to the floating gate electrode 735 of Y-ROM memory cell 703, except that floating gate electrode 725 is fabricated such that the distal ends of the elongated extension portions 725$_2$ and 725$_3$ are 'clipped' with respect to those included in Y-ROM memory cell 703. That is, the polysilicon gate mask used to pattern floating gate electrodes 725 and 735 is fabricated such that the extension portions 725$_2$-725$_3$ are smaller (shorter) than the floating gate extension portions 735$_2$-735$_3$. As a result, Y-ROM memory cell 702 exhibits a smaller drain-to-gate capacitive coupling (and therefore a higher threshold voltage) than Y-ROM memory cell 703.

Floating gate electrode 715 of Y-ROM memory cell 701 is similar to the floating gate electrode 725 of Y-ROM memory cell 702, except that floating gate electrode 715 is fabricated with shorter elongated extension portions. As a result, Y-ROM memory cell 701 exhibits a smaller drain-to-gate capacitive coupling (and therefore a higher threshold voltage) than Y-ROM memory cell 702.

Also during the fabrication of Y-ROM memory cells 701-704, the source regions 711, 721, 731 and 741 and the drain regions 712, 722, 732 and 742 are all exposed to receive the HV-LDD implant of the CMOS process (rather than the LV-LDD implant). The drain extension regions 714, 724, 734 and 744 are also exposed to receive this HV-LDD implant. In accordance with one embodiment, the HV-LDD implant is performed by implanting $BF_2$ at an energy of about 20 keV and a dosage of about $10^{14}$ $cm^{-2}$. In general, the HV-LDD implant (unlike the LV-LDD implant) is optimized to minimize channel hot electron injection. The absence of $BF_2$ in the HV-LDD implant advantageously minimizes the CHE effects and stabilizes the threshold voltages of Y-ROM memory cells 701-704. Suppressing hot electron generation in the channel advantageously eliminates read disturb issues in Y-ROM memory cells 701-704.

Also during the fabrication of Y-ROM memory cells 701-704, drain extension regions 714, 724, 734 and 744 are exposed to receive the LV-LDD implant of the CMOS process. Again, based on the relatively small widths of the floating gate extension portions $725_2$-$725_3$, $735_2$-$735_3$ and $745_2$-$745_3$, and the relatively high impurity concentration in drain extension regions 724, 734 and 744, the implanted impurities in these drain extension regions will merge under these floating gate extension portions after the impurities are activated. This advantageously provides increased capacitance between drain extension regions 724, 734 and 744 and the corresponding floating gate extension portions $725_2$-$725_3$, $735_2$-$735_3$ and $745_2$-$745_3$. Note that sidewall spacers (not shown) of the CMOS process are subsequently formed adjacent to floating gate electrodes 715, 725, 735 and 745, and a heavily doped source/drain (HDD) implant is subsequently performed into the portions of source regions 711, 721, 731 and 741, drain regions 712, 722, 732 and 742 and drain extension regions 714, 724, 734 and 744 that are not covered by these sidewall spacers.

In the present example, Y-ROM memory cells 701, 702, 703 and 704 exhibit read threshold voltages of about 4.2 Volts, 3.2 Volts, 2.2 Volts and 1.2 Volts, respectively. As a result, Y-ROM memory cells 701-704 represent four different bit values in the present example. The effective area per bit of Y-ROM memory cells 701-704 is less than or equal to 1 $micron^2$/bit. Note that Y-ROM memory cells 701-704 do not require electrical initialization (i.e., program or erase operations). Ultraviolet initialization can be considered, if for some reason, the floating gate electrodes 715, 725, 735 and 745 are charged in the CMOS process flow.

As described above, the conversion from Y-Flash memory cell 600 to Y-ROM memory cells 701-704 is very easy, and requires changes only in the HV-LDD and LV-LDD masks and the polysilicon gate electrode mask (which serves as the threshold voltage code mask).

In accordance with an alternate embodiment, drain extension regions 714, 724, 734 and 744 can be fabricated to have different dopant concentrations, thereby further adjusting the threshold voltages of Y-ROM memory cells 701-704. That is, different drain extension regions could be doped to different dopant concentrations. For example, one drain extension region could be fabricated such that the HV-LDD implant is received, but the LV-LDD implant and the HDD implant are not received, while another drain extension region could be fabricated such that the LV-LDD implant and the HDD implant are received, but the HV-LDD implant is not received. Any combination of receiving/not receiving the LV-HDD implant, the HV-LDD implant and HDD implant can be implemented. In general, the higher the dopant concentration in the drain extension region, the greater the coupling to the floating gate extension regions, and the lower the resulting threshold voltage.

An additional advantage of Y-ROM memory cells 701-704 is that these cells can be implemented in ASICs that implement either 3.3 Volt or 5 Volt I/O voltages.

The S-ROM and Y-ROM memory cells described above have low operation voltages, simple array and periphery design, and can be implemented without changing the read-out circuits and other elements of the array periphery of the corresponding S-Flash and Y-Flash memory cells. Advantageously, the S-ROM and Y-ROM memory cells of the present invention only require the modification of the pattern of existing masks in the CMOS process mask set.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A method of Flash-to-ROM conversion for a flash memory cell having charge storage structures located adjacent to sidewalls of a gate electrode, the method comprising:
    performing a threshold voltage implant into a semiconductor substrate, wherein the threshold voltage implant introduces impurities into the semiconductor substrate in alignment with a first side of a gate electrode of a first memory transistor, thereby forming a first threshold voltage implant region in the semiconductor substrate;
    forming sidewall dielectric structures adjacent to the gate electrode; and then
    performing a heavily doped drain (HDD) implant into the semiconductor substrate, wherein the HDD implant introduces impurities into source/drain contact regions of the semiconductor substrate, wherein the impurities of the HDD implant are aligned with the sidewall dielectric structures.

2. The method of claim 1, further comprising preventing impurities of the threshold voltage implant from being introduced to the semiconductor substrate in alignment with a second side of the gate electrode of the first memory transistor.

3. The method of claim 1, wherein the first threshold voltage implant region adjusts the threshold voltage of a read access to the first memory transistor in a first direction.

4. The method of claim 3, wherein the threshold voltage implant is performed through an opening in a mask, the method further comprising adjusting the width of the opening in the mask to adjust the threshold voltage of the read access to the first memory transistor in the first direction.

5. A method of Flash-to-ROM conversion comprising:
    forming a floating gate electrode having a first portion that extends over a channel region of a memory transistor and one or more extension portions, wherein the first portion has a first width and the one or more extension portions each has a second width that is less than the first width;
    forming a drain extension region, which is continuous with a drain region of the memory transistor, wherein the drain extension region is continuous under the one or more extension portions of the floating gate electrode; and selecting a length that the one or more extension portions of the floating gate electrode extend over the drain extension region from a plurality of lengths.

6. The method of claim 5, further comprising forming source and drain regions in alignment with the first portion of the floating gate electrode, wherein the source and drain regions are selected to minimize hot electrons in the channel region.

\* \* \* \* \*